United States Patent [19]
Yoshizawa et al.

[11] Patent Number: 6,070,223
[45] Date of Patent: May 30, 2000

[54] ASSOCIATIVE MEMORY DEVICE AND NETWORK FRAME SWITCH

[75] Inventors: Hiroshi Yoshizawa; Masato Yoneda, both of Chiba, Japan

[73] Assignee: Kawasaki Steel Corporation, Kobe, Japan

[21] Appl. No.: 09/037,710

[22] Filed: Mar. 10, 1998

[30] Foreign Application Priority Data

Mar. 10, 1997 [JP] Japan .................................. 9-054394

[51] Int. Cl.[7] .................................................. G06F 12/00
[52] U.S. Cl. ........................ 711/108; 711/158; 711/159; 702/187
[58] Field of Search ................................... 711/108, 158, 711/159; 707/3, 6; 702/187

[56] References Cited

U.S. PATENT DOCUMENTS

| | | | |
|---|---|---|---|
| 4,969,088 | 11/1990 | McAuliffe et al. | 709/241 |
| 5,390,318 | 2/1995 | Ramakrishnan et al. | 711/158 |
| 5,414,704 | 5/1995 | Spinney | 370/389 |
| 5,649,110 | 7/1997 | Ben-Nun et al. | 370/351 |
| 5,751,993 | 5/1998 | Ofek et al. | 711/136 |

*Primary Examiner*—John W. Cabeca
*Assistant Examiner*—Brian R. Peugh
*Attorney, Agent, or Firm*—Oliff & Berridge, PLC

[57] ABSTRACT

The present invention provides a network frame switch and a content addressable memory (CAM). The CAM includes a plurality of word memories which store a plurality of data pieces in such a way that those data pieces can be rewritten and registers which corresponding to the plurality of word memories respectively. The registers store information indicating whether valid target data is stored in the corresponding word memories, so that when retrieval data is input, the system retrieves word memories that store target data having a data part whose position corresponds to a prescribed first data part extracted from the input retrieval data. The CAM further includes a retrieval result correspondence write-in device which performs retrieval of word memories which store target data comprising a data part whose position corresponds to the first data part. Depending on whether any word memories are detected, the data part whose position corresponds to a second data part that is different from the first data part and which is extracted from the input retrieval data out of the target data stored in one or more word memories selected from the detected word memories, is overwritten by the same information as the second data part or the input retrieval data is written in one word memory selected from one or more word memories other than the word memory storing valid target data using the retrieval result correspondence write-in device.

11 Claims, 7 Drawing Sheets

ASSOCIATIVE MEMORY DEVICE AND NETWORK FRAME SWITCH

BACKGROUND OF THE INVENTION

1. Field of the Invention

The invention relates to a memory provided with retrieval features. Specifically, the invention refers to a content addressable memory (CAM) and a network frame switch which is located in a communication network and is used to switch network frames transferred via the communication network.

2. Description of Related Art

Conventionally, content addressable memories have been proposed that store data in a plurality of word memories before retrieval data is input. The conventional CAM retrieves one of the word memories which contains a bit pattern that matches or "hits" the bit pattern of all or a prescribed portion of the input retrieval data.

Figure 3:
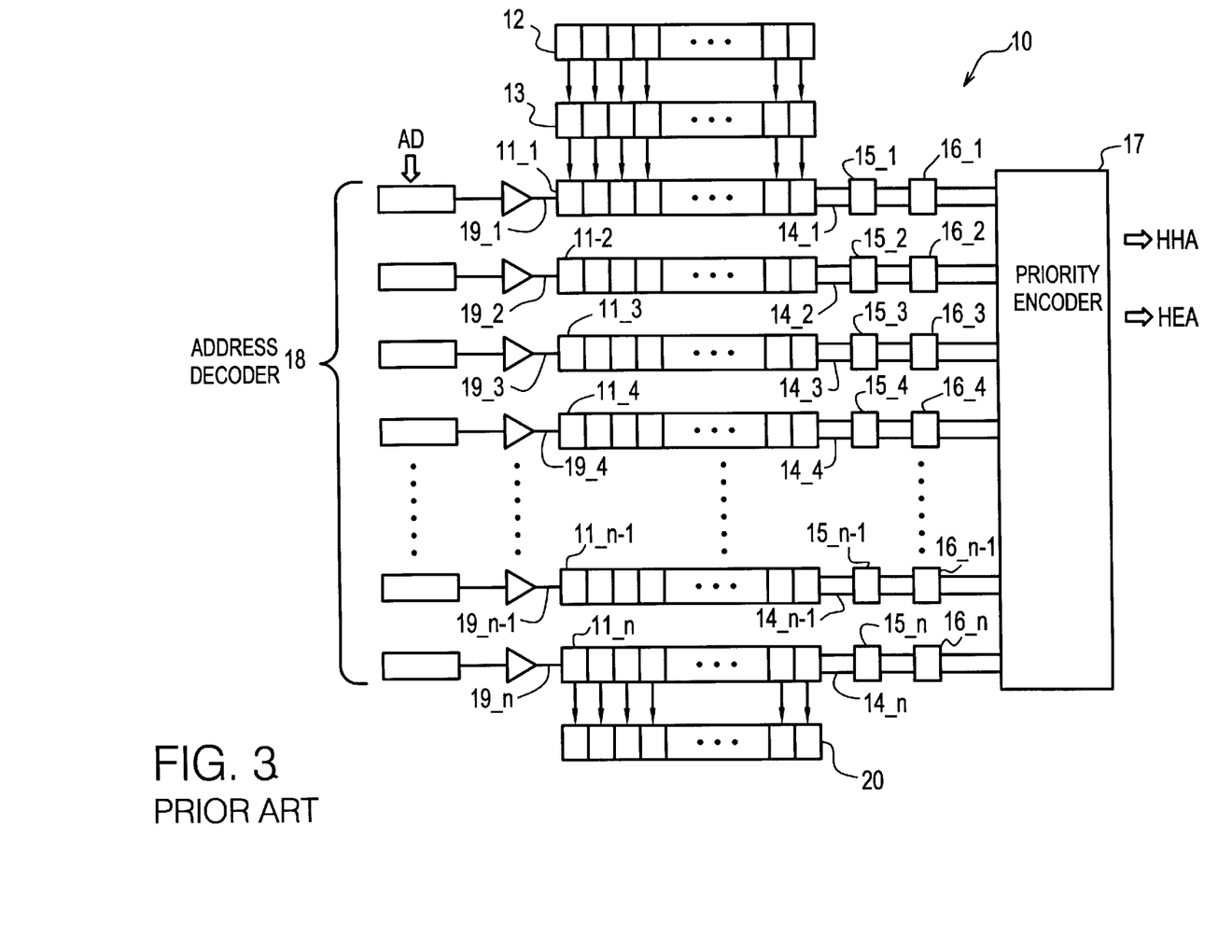
FIG. 3 is a circuit diagram of a conventional CAM.

FIG. 3 is a circuit block diagram of a conventional CAM 10. The CAM 10 has a vertical array of word memories 11_1, 11_2, . . . , 11_n, each of which has m bits of horizontal memory cells. In addition, the CAM 10 has a retrieval data register 12 which receives and latches one word of retrieval data. The CAM 10 also has a mask data register 13 which latches mask data (data that defines a portion of data valid for retrieval) out of retrieval data latched in the retrieval data register 12, i.e. the mask data register 13 masks a data portion not associated with retrieval.

The system decides a hit or miss by comparing the bit pattern of the retrieval data latched in the retrieval data register 12, which is not masked by the mask data latched in the mask data register 13, and the bit patterns of the data stored in the word memories 11_1, 11_2, . . . , 11_n. A hit is determined when the bit pattern of the retrieval data matches a bit pattern stored in a word memory. The system outputs hit flag logic 1 to the hit lines corresponding to those word memories 11_1, 11_2, . . . , 11_n that contain a "hit" bit pattern. The other hit lines remain at logic 0 designating a miss.

The CAM 10 has empty flag registers 15_1, 15_2, . . . , 15_n, corresponding to the word memories 11_1, 11_2, . . . , 11_n, which store an empty flag. The empty flag discriminates between logic 0, indicating valid retrieval data stored in those word memories and logic 1 indicating an empty status, i.e. that valid data is not stored in that word memory.

During the above mentioned retrieval, the system retrieves only those word memories with an empty flag in the empty flag registers 15_1, 15_2, . . . , 15_n being logic 0 (indicating retrieval data is stored in the word memory).

The empty flags stored in the empty flag registers 15_1, 15_2, . . . , 15_n are input to a priority encoder 17. The priority encoder 17 outputs, in a prescribed priority, the address data Highest Empty Address (HEA) which corresponds to the highest priority flag register (in this case, empty flag register 14_n−1) out of empty flag registers in which a logic 1 empty flag is stored (in this case, empty flag registers 14_n−1 and 14_n). The address data HEA is always output irrespective of retrieval. To store new retrieval data in blank addresses of the CAM 10, the corresponding address data HEA must be referenced.

Like in retrieval, when storing data to the CAM 10, irrespective of whether the data is to be stored to blank addresses or not, the mask data stored in the mask data register 13 works effectively to overwrite only the data portions not masked by the mask data so that the masked data portions all remain unchanged.

The signals output to the hit lines 14_1, 14_2, . . . , 14_n during the above mentioned retrieval operations are stored in the hit flag registers 16_1, 16_2, . . . , 16_n respectively. Suppose here, as an example, that "0, 1, 1, 0, . . . , 0, 0" are stored in the hit flag registers 16_1, 16_2 , 16_n respectively. In this case logic 0, indicating a miss, is stored in the hit flag registers corresponding to those empty flag registers in which empty flag logic 1. Indicating an empty word memory, is stored even if a bit pattern coincident with retrieval data is stored in the word memory.

Like empty flags, hit flags stored in the hit flag registers 16_1, 16_2, . . . , 16_n are also input to the priority encoder 17. The priority encoder 17 outputs, in a prescribed priority order, the address data Highest Hit Address (HHA) which corresponds to the highest priority hit flag registers (in this case, hit flag registers 16_2 and 16_3) out of the hit flag registers in which hit flag logic 1 is stored. This example assumes that a smaller subscript register has a higher priority so that the memory address which corresponds to the hit flag register 16_2 is output.

The CAM 10 has a function to receive address signals in order to carry out read/write operations to designated addresses. When, for example, address data HHA is input from the priority encoder 17 into the address decoder 18 as address data AD, the address decoder 18 decodes this address data AD and outputs an access signal (logic 1 signal in this case) to one word line (in this case, word line 19_2). The access signal corresponds to the address data AD. For example, the data stored in the word memory 11_2 corresponding to the word line 19_2, to which an aaccess signal has been output, is read out to an output register 20.

The CAM 10 also has a function to erase the contents of all the word memories which have been hit by retrieval. Specifically, the content of the empty flag registers corresponding to all the word memories which have been hit by retrieval are replaced with logic 1 (blank status). This function is used, for example, to erase all lesser recent data of the data stored in the CAM 10 provided in, for example, a network frame switch, which will be described hereafter.

As mentioned above, the CAM 10 uses all or a prescribed portion of retrieval data to retrieve data stored in a number of word memories 11_l, 11_2, . . . , 11_n, in order to acquire the address HHA of the word memory that has coincident data. One of the main applications of such CAMs is a network frame switch which switchs the reception/transmission of network frames. The following will outline such a network frame switch.

Figure 4:
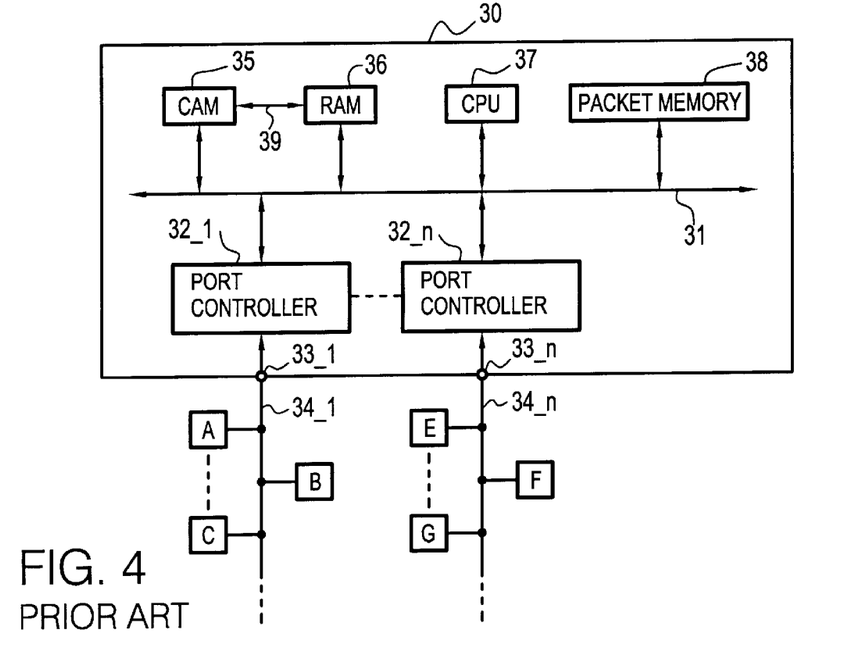
FIG. 4 is a circuit diagram of a conventional network frame switch.

Conventionally, in 9 network system, there has been employed a network frame switch, called a "hub," which switchs the transmission of network frames as an aggregate of information transferred over the network. FIG. 4 is a circuit block diagram of an exemplary configuration of a conventional network frame switch. The network fram switch 30, includes n number of port controllers 32_1, . . . , 32_n connected to a bus 31, n number of ports 33_1, . . . , 33_n corresponding to port controllers 32 1, . . . , 32_n, LANs 34_1, . . . , 34_n connected to the ports 33_1, . . . , 33_n, and a plurality of terminals A, B, . . . C, . . . E, F, . . . G connected to LANs 34_1, . . . , 34_n. Additionally, the bus 31 is provided with a CAM 35, a RAM 36, a CPU 37 and a packet memory 38.

The CAM 35, to which a retrieval function is added. is expensive in terms of the cost per bit and has a small memory capacity as compared to ordinary RAMs. To solve this problem, the network frame switch 30 uses the CAM 35 and the RAM 36 concurrently in such a way that only such data as directly required for retrieval is stored in the CAM 35. The data not directly associated with retrieval is stored in the RAM 36. The addresses of the word memories of the CAM 35 correspond to the addresses of the memory areas of the RAM 36 and are accessible via a signal line 39. The CAM 35 stores the address data of terminal addresses and the time stamp information, described hereafter. The RAM 36 stores the port numbers of ports connected with the terminals, the data of Virtual LAN (VLAN), and the other data referenced by the hardware of the network frame switch 30.

The CPU 37 has overall control of the network frame switch 30 while the packet memory 38 temporarily stores network frames which have been transmitted. The network frame switch 30 is usually provided with various other devices, which are not directly concerned here and. therefore, not shown nor described.

The operation of the conventional network frame switch 30 will now be described. Let us assume, for example, that a terminal B connected to the LAN 34_1 sends certain information having a network frame format to a terminal E connected to LAN 34_n. In this example, the network frame has at its header, a record of the reception destination of the information, i.e., the destination address indicating terminal E, and the transmission source of the information, i.e., the source address indicating terminal B.

A network frame transmitted via port 33_1 from terminal B is first stored in the packet memory 38 via the port controller 32_1 and the bus 31. The CPU 37 extracts the destination address indicating a data transmission destination (terminal B in this example) from the header in the network frame and then sends it to the CAN 35. The CAM 35 has a record of the address data indicative of terminals A, B, . . . C, . . . , E, F, . . . G which constitute the network system. The RAN 36 stores the port numbers indicative of the connection destination of the terminals A, B, . . . C, . . . , Z, F, . . . G via parts 33_1, . . . , 33_n.

Address data indicating the destination address is input to the CAM 35 and the address HHA of a word memory of the CAM 35, which stores the same address data as the input address data, is output. In response, the port number indicative of the terminal connection destination indicated by the destination address is read out based on the address corresponding to the address HHA of the RAM 36. Based on the part number read out, the CPU 37 recognizes this network frame as one to be transmitted to port 33_n.

In this manner, when a port number is read out from the RAM 36, a network frame is subsequently input from the packet memory 38 via the bus 31 to the port controller 32_n and then is sent via port 33_n and LAN 34_n to terminal E. Thus, a network frame switch effectively uses CAMs for speedy retrieval of addresses.

Figure 5:
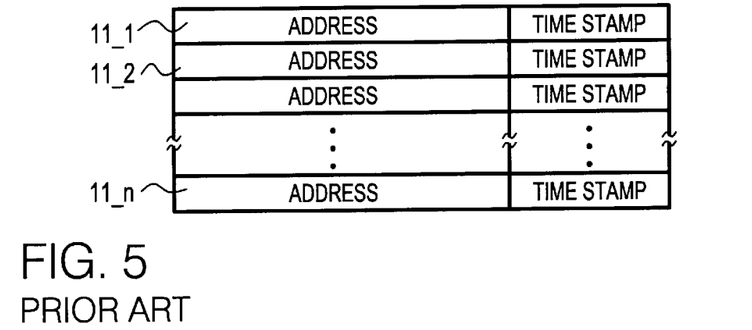
FIG. 5 shows the data stored in a CAM provided to the network frame switch of FIG. 4.

FIG. 5 shows data stored in the CAM 35 of the network frame switch 30 shown in FIG. 4. Each of the word memories 11_1, 11_2, . . . , 11_n, stores the address data, indicative of the address of each terminal, and the time stamp information. As mentioned above, a destination address extracted from a network frame is used to carry out retrieval. From an address stored in RAM 36 corresponding to the address HHA obtained as a result of the retrieval, the port number to which the network frame is to be transmitted is determined.

Figure 6:
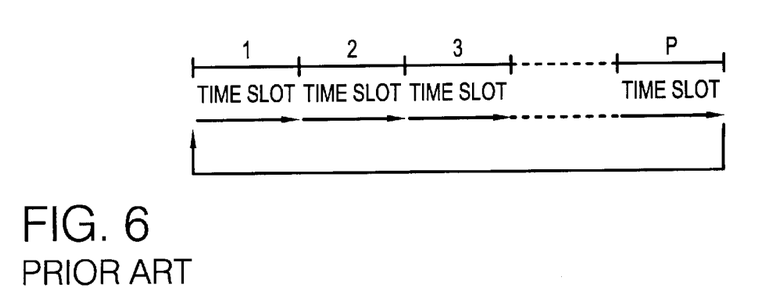
FIG. 6 shows an example of time stamp information.

Besides terminal address data, each word memory stores time stamp information. FIG. 6 shows an example of time stamp information. A prescribed time interval is considered to be one time slot so that p number of time slots are cycled one by one as time passes. To discriminate the p number of time slots from each other, their numbers, for example 1, 2, . . . , p, are called time stamp information.

When retrieval for CAM 35 is carried out based on a source address extracted from a network frame and, as a result, the same address as the source address is detected, time stamp information of the corresponding word memory is overwritten by the time stamp information indicating the time slot of that point in time. If, as a result of retrieval, the same address as the source address is not detected, data comprising that source address and time stamp information indicating a time slot of the current point in time is written into blank addresses. At the same time, the port number of a port to which a network frame having that source address has been transmitted is written into the RAM 36.

For each time interval, retrieval is carried out for CAM 35 using the time stamp information of the immediately previous time slot, If, as a result, the same time stamp information as that time stamp information of the previous time slot is detected, the data of the corresponding word memory is erased at that time. That is, as mentioned above, the contents of the empty flag register corresponding to that word memory are replaced by the contents that indicate emptiness. By erasing the address information of terminals which have not been concerned with communication for a long time, blank addresses in the CAM 35 can be used to for storage of new data.

Figure 7:
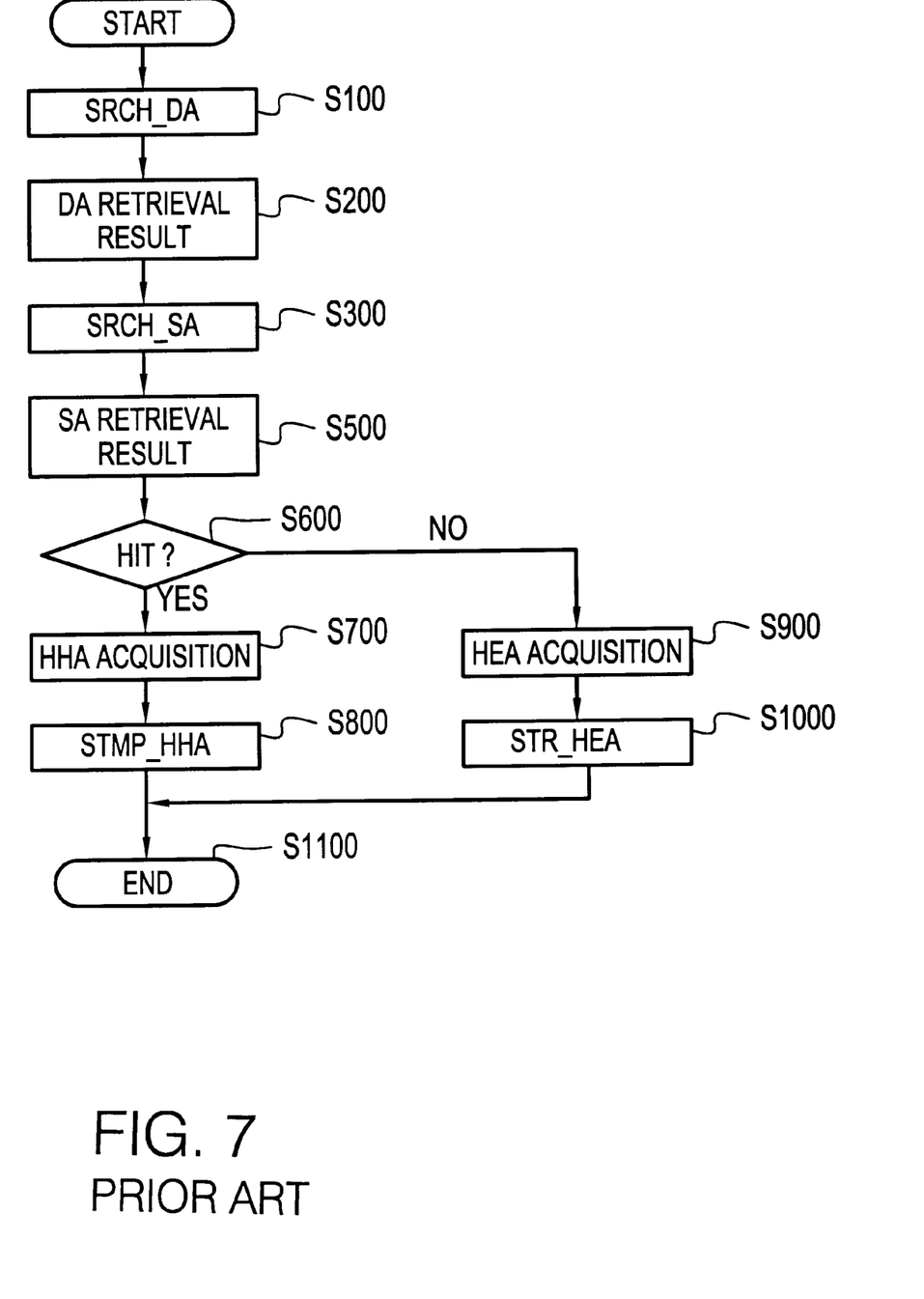
FIG. 7 is a flowchart of a procedure of operations carried out in the network frame switch of FIG. 4.
Figure 8:
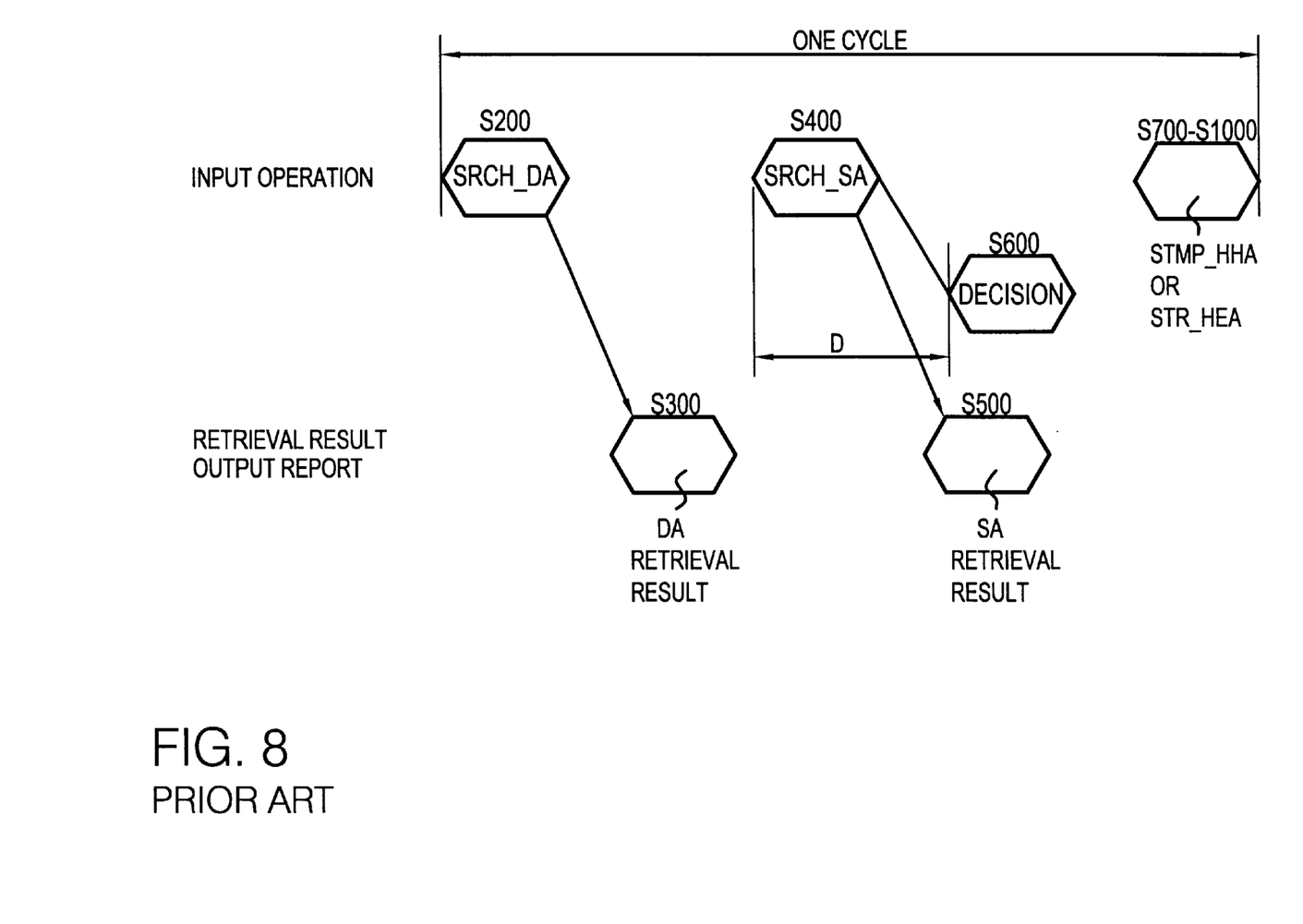
FIG. 8 is a timing chart of the procedure illustrated in the flowchart of FIG. 7.

In a network frame switch 30 having the above described configuration, the operations shown in FIG. 7 are carried out. FIG. 7 is a flowchart of the operations within a network frame switch such as shown in FIG. 4. FIG. 8 is a timing chart of the procedure.

In step 100, when a network frame is input from a port, a destination address DA indicative of a transmission destination is extracted from the network frame. Then, in stop S200, based on the destination address DA, retrieval is carried out. As a result, in step S300, an address HHA of a word memory which stores the same address as the destination address DA is output. Retrieval based on the destination address DA is abbreviated as SRCH_DA here.

The address HHA obtained by SRCR_DA is input to the RAM 36, thus reading out the port number of a destination port. In stop S400, after the address HHA is output, a source address SA, indicative of the transmission source address, is extracted from the network frame. The source address SA is then used by the CAM 35 in stop S500, to carry out retrieval.

Next, in stop S600, based on the retrieval results, it is decided whether the same address as the source address SA used in the retrieval, is already stored (i.e., hit) in the CAM 35. This decision is made in the CPU 37 in such a configuration as shown in FIG. 4. Retrieval based on the source address SA is abbreviated as SRCH_SA here.

In stop S700, If a hit is recognized as a result of the decision, the hit address HHA is acquired and, in step S800, the time stamp information of the address HHA is overwritten by the time stamp information of the time slat of the current poaint in time. The overwriting of the time stamp information of the address HHA is abbreviated as STMP_HHA. The time stamp information is thus overwritten to postpone the timing of erasing the information about a source address SA which belongs to a terminal, at the current point in time, which has participated in communication, from CAM 35.

On the other hand, if a miss is recognized in step S600, i.e. It is decided that the same address as a source address SA used in retrieval is not stored in CAM 35. In step S900, a top priority blank address (HEA) is acquired, so that in stop S1000, retrieval data (see FIG. 5) comprising the source address SA and the time stamp information of a time slot at the current point in time is stored in the address HEA for the next retrieval. The storing of retrieval data in the address HEA is abbreviated as STR_HEA here. Accordlng to the STR_HEA, the RAM 36 stores the port number of a port which has transmitted network frames having the source address SA.

To switch network frames speedily in this case, It is necessary to work out a method to speedily perform a series of processes such as described with reference to FIGS. 7 and 8. In other words, it is necessary to reduce the time required for each cycle shown in FIG. 8. One method for this purpose is to use a dedicated sequencer in place of the CPU 37 to perform the decision at step S600 or to employ a pipeline for a series of processes as described below.

Figure 9:
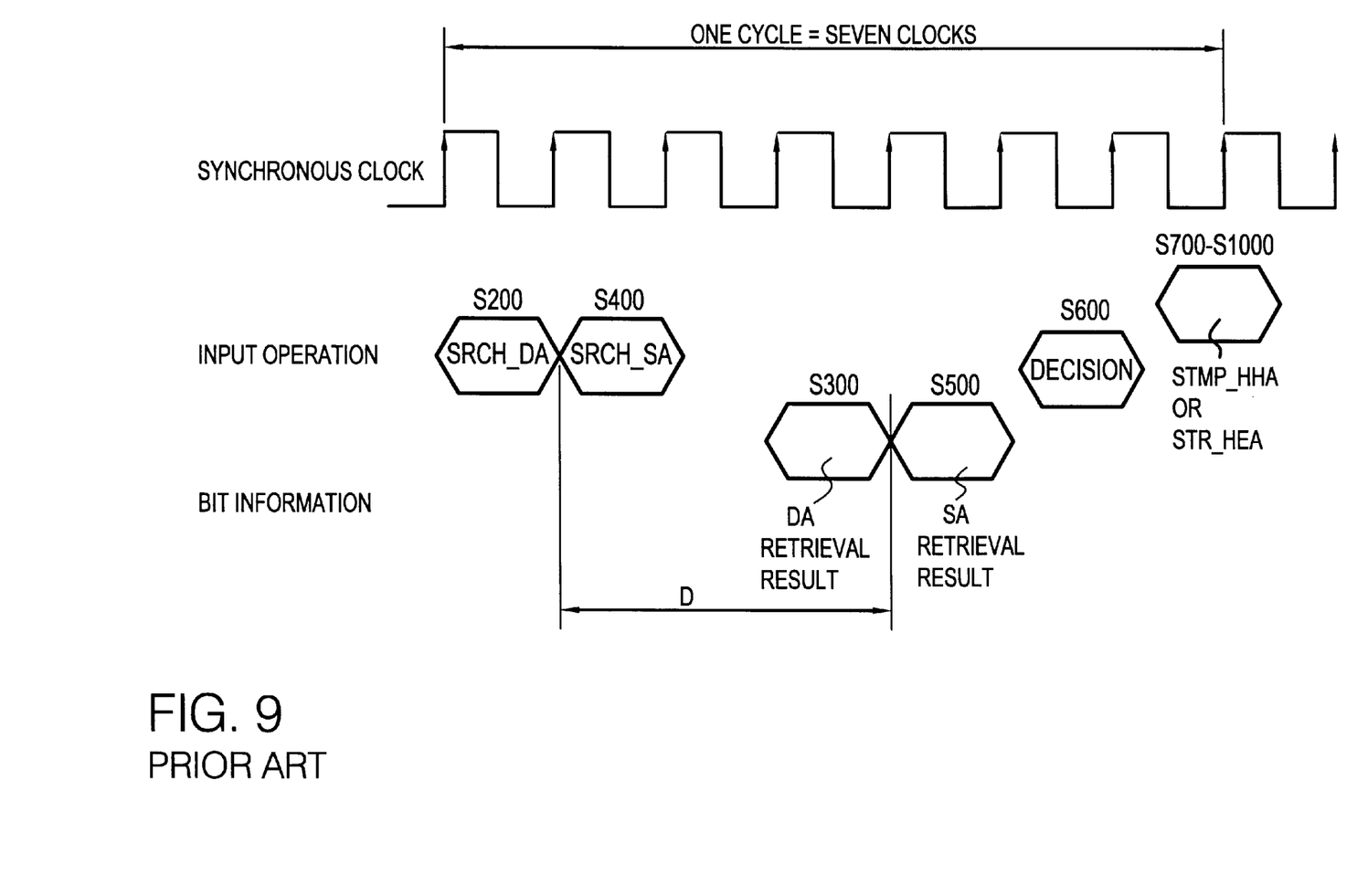
FIG. 9 is a timing chart of a flow of processing by a conventional pipelined network frame switch.

FIG. 9 is a timing chart of a processing flow by a network frame switch when a pipeline system is employed. Although, as a result of pipelining, the CAM 35 can perform SRCH_SA operations subsequent to the SRCH_DA operations, time D required for acquiring the retrieval results cannot be reduced by pipelining because the time is limited by the retrieval speed of the CAM 35 Itself. Thus, in a series of cycles, overhead time takes a significant portion of the time that is required to decide STMP_HHA or STR_HEA. This problem prevents the processing from being performed more quickly.

SUMMARY OF THE INVENTION

In consideration of the problems of the prior art, the present invention provides a network frame switch that performs a series of processes required in the switch more quickly and provides a content addressable memory (CAM) that realizes quicker processing.

The CAM of the present invention includes a plurality of word memories which store a plurality of data pieces in such a way that these data pieces can be rewritten. The CAM further includes registers which correspond to the plurality of word memories respectively. The registers store information indicating whether valid target data is stored in the corresponding word memories. When retrieval data is input, the system retrieves word memories that store target data having a data part whose position corresponds to a proscribed first data part extracted from the input retrieval data.

The CAM further includes a retrieval result correspondence write-in device which performs retrieval of word memories which store target data comprising a data part whose position corresponds to the above mentioned first data part. Depending on whether any word memories are detected, the data part whose position corresponds to a second data part that is different from the first data part and which is extracted from the input retrieval data, is overwritten by the same information as the second data part using the retrieval result correspondence write-in device or the input retrieval data is written in a word memory selected from one or more word memories other than the word memory storing valid target data.

The above mentioned CAM is configured so that the retrieval result correspondence write-in device operates in response to commands which are input externally. The above mentioned CAM is also confirmed so that the retrieval result correspondence write-in device comprises a selection device that selects mask information to mask retrieval data to be written in the word memories, based on the retrieval results, in response to the input commands.

Further, retrieval result correspondence write-in device of the CAM includes a group of mask registers which hold mask information to mask retrieval data to be written in the word memories corresponding to each retrieval result. The retrieval result correspondence write-in device selects one mask register out of the group of mask registers which corresponds to that retrieval result, in response to the input commands.

In addition, the present invention provides a network frame switch that is placed in a communication network having a plurality of interconnected commuinication terminals with their own addresses. The network frame switch switchs the transumisson/reception of network frames, which are an aggregate of information including source addresses, i.e., the address of a transmission source communication terminal.

The network frame switch includes a CAM which has a plurality of word memories which store data in a manner that it can be rewritten. The data includes the addresses of the communication terminals and the time information indicating the most recent time when those addresses were accessed. The CAM further includes registers that correspond to the word memories and which store information indicating whether valid target data is stored in the corresponding word memory. When retrieval data, including address data of the communication terminal addresses and the time information indicating the current time, is input, the CAM retrieves word memories that store target data including the address data whose position corresponds to the address data of the input retrieval data.

The CAM also includes a retrieval data generation device which extracts source addresses from transmitted network frames to generate retrieval data including the address data indicating the extracted source addresses and the time information indicating the current time. The retrieval data generation device then supplies the retrieval data to the CAM. Additionally, the CAM includes a retrieval result correspondence write-in device which retrieves word memories that store data having address data whose position corresponds to the address data contained in the input retrieval data. Depending on whether any word memories have been detected, the time information is overwritten by the same information as the time information contained in the input retrieval data or the input retrieval data is written in one word memory selected from one or more word memories other than the word memories which store valid target data.

The network-frame switch of the present invention uses time stamp information that discriminates a plurality of cyclically switched time slots from each other. Each time slot is equal to a prescribed time interval.

The CAM of the present invention will, in response to the retrieval results based on the first data part of input retrieval data, overwrite data corresponding to the second data part of the retrieval data of a hit address HHA by the same information as the second data part. In the case of a miss, the CAM will write the retrieval data in an empty address HEA. By employing such a CAM in a network frame switch and allowing the first data part and the second data part to correspond to address data and time stamp information respectively, it is unnecessary to decide the retrieval results of source addresses outside the CAM. Thus the CAM of the present invention enables faster performance of a series of processes and quicker switching of network frames.

BRIEF DESCRIPTION OF THE DRAWINGS

For a more complete understanding of the present invention and the advantages thereof, reference is now made to the following description taken in conjunction with the accompanying drawing, in which.

DETAILED DESCRIPTION OF THE PREFERRED EMBODIMENTS

Figure 1:
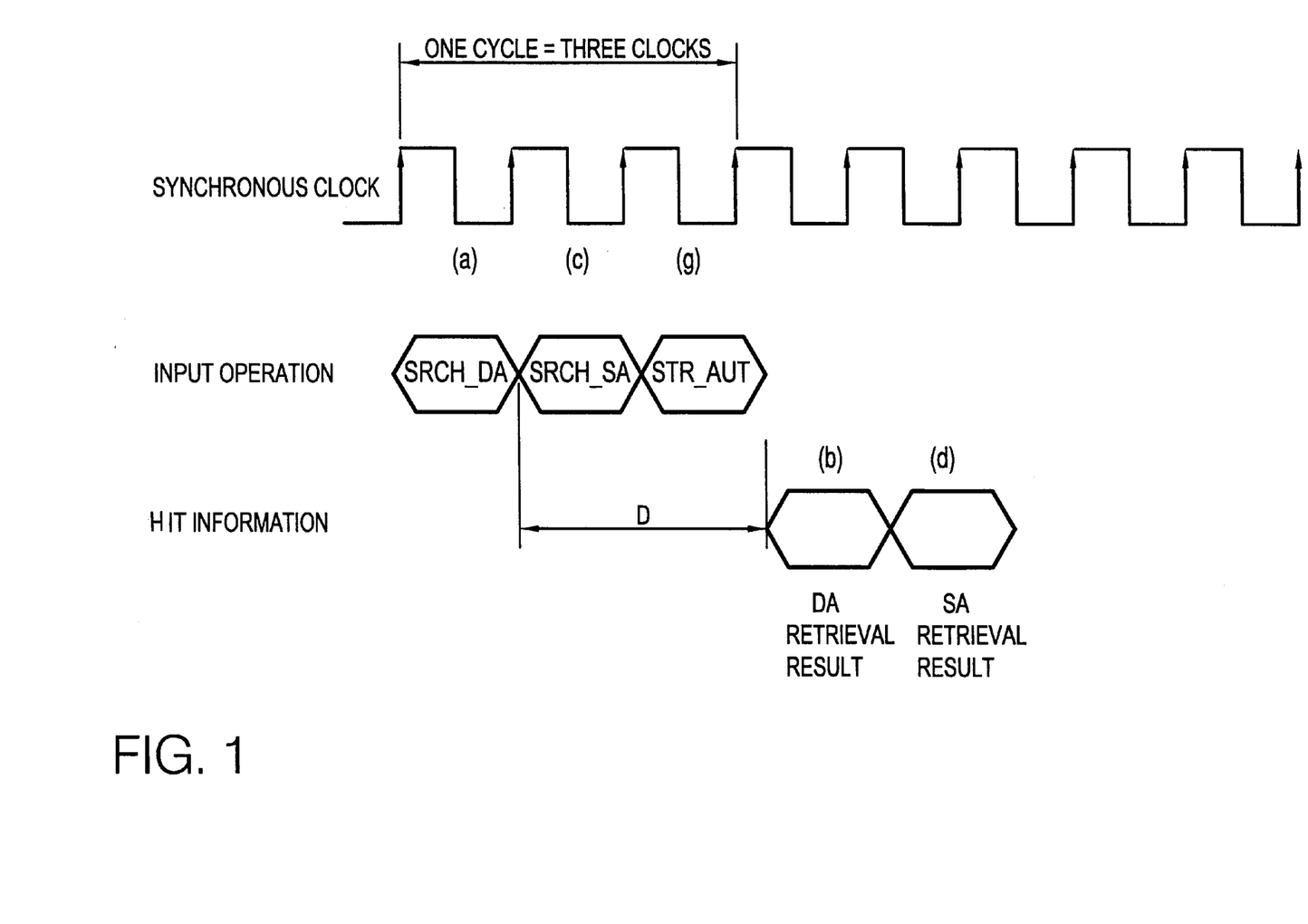
FIG. 1 is a timing chart of one embodiment of a network frame switch of the present invention.

FIG. 1 shows a timing chart for one embodiment of a network frame switch of the present invention. With this embodiment, pipeline processing is effected to input STR_AUT subsequent to SRCH_DA and SRCH_SA. The STR_AUT function is an operation which instructs the system to store the time stamp information of the current time in address HHA in response to the retrieval results by the immediately previous retrieval SRCH_SA in the case of a hit. In the case of a miss, the STR_AUT operation instructs the system to store the retrieval data itself (source address+ time stamp information) in the address HEA. By adding this STR_AUT operation to the CAM itself, It is unnecessary for the CAM to wait until the source address retrieval results are output, thus enabling very high speed performance of a series of processes.

Figure 2:
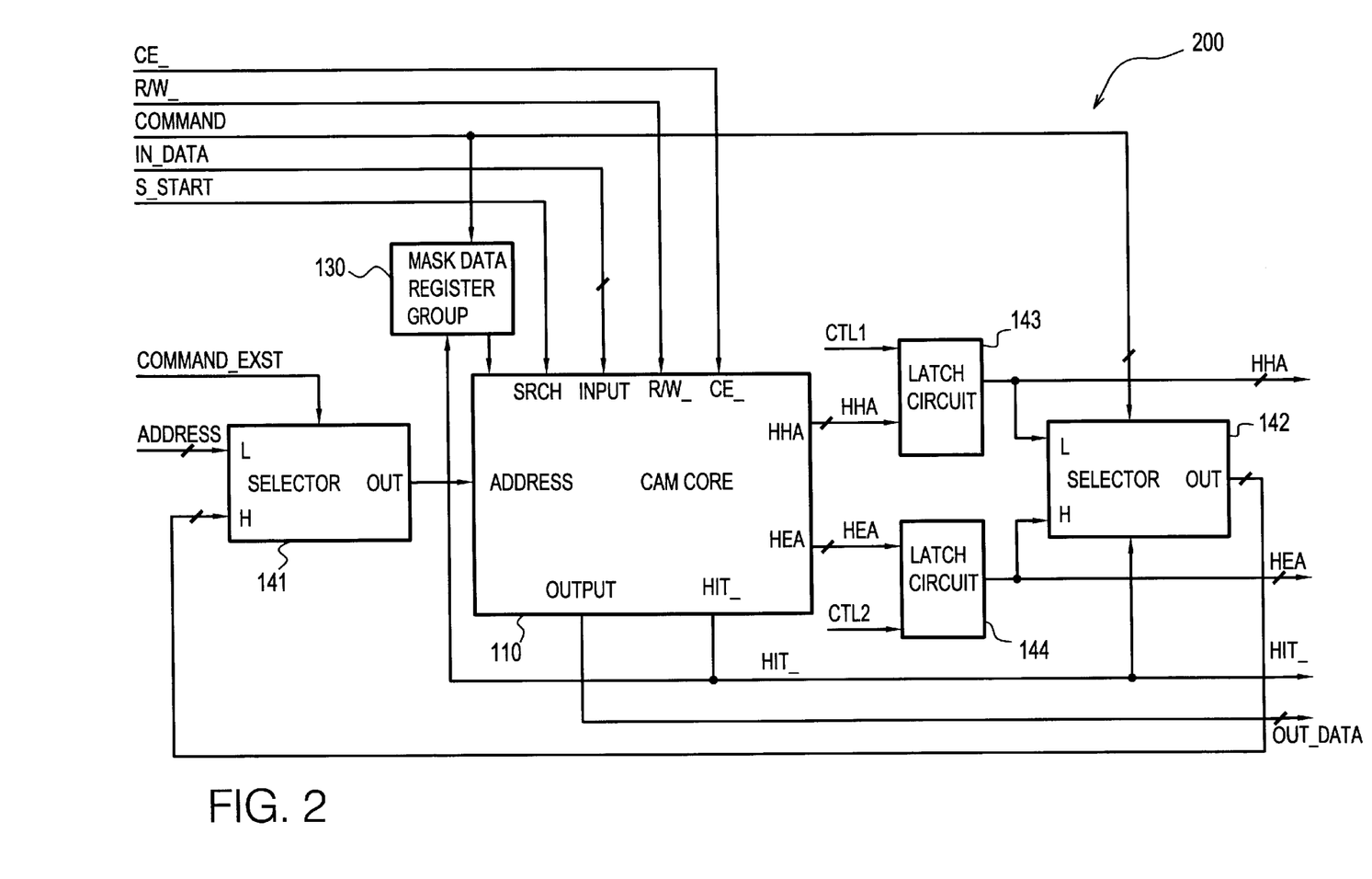
FIG. 2 is a block diagram of the configuration of one embodiment of a CAM according to the present invention.

FIG. 2 shows a block diagram of the configuration of a CAM 200 of the present invention. The CAM 200 comprises a CAM core 110 provided with a number of word memories. Retrieval starts when retrieval data is given as input data IN_DATA and a retrieval start signal S_START is input to the CAM care 110, retrieval starts. In this retrieval from a mask data register group 130, one mask data register corresponding to an externally input command (COMMAND) is selected from the mask data register group 130. Based on the mask data stored in the selected mask data register, part of the input retrieval data is masked before retrieval actually starts. The COMMAND may designate any one of the three commands: STAMP_HHA, STR_HEA, and STR_AUT. The COMMAND may also indicate that none of these three commands has been input. Therefore, the COMMAND has four states, which are indicated in two bits. A command exist signal (COMMAND_EXST) is input into the first sector 141 and indicates whether any one or none of the three commands has been input.

The CAM 200 may receive an external address (ADDRESS) and the enable signal CE_ with the R/W_ signal hold down at Low, in order to store input data (IN_DATA) in the corresponding address. Alternatively the CAM 200 may receive the external address (ADDRESS) and the enable signal CE_ with the R/W_ signal hold up at High, in order to fetch the data stored in the corresponding address as output data (OUT_DATA).

In response to the COM AND_EXST signal, if none of the three commands has been input, the first selector 141 selects an external address (ADDRESS) and inputs it to the CAM core 110. When any one of the three commands has been input, it takes up HHA or HEA selected by the second selector 142 and inputs it to the CAM core 110.

When retrieval data is input to the CAM core 110 as input data IN_DATA and then the retrieval start signal S_START is input to it, the CAM core 110 starts retrieval therein by use of the first data part of the retrieval data that is not masked by the mask data. If a hit is detected as a result of the retrieval, the CAM core 110 outputs HHA and also a hit signal HIT_ which indicates a hit/miss state. This HHA address is output from the CAM 200 and then latched in the first latching circuit 143 by the first control signal CTL1. The hit signal HIT_ is output from the CAM 200 and input to the mask data register group 130, thus contributing to the switch over of mask data registers. The switch over of the mask data registers is described hereinafter.

Additionally, an empty address HEA is output from the CAM core 110 and then output from the CAM 200 and latched in the second latching circuit 144 by the second control signal CTL2. Both of HHA and HEA latched in the first and second latching circuits 143 and 144 respectively, are input to the second selector 142 which selects either one of them and inputs it to the first selector 141.

The second selector 142 actually carries out the selections listed in the Table 1 below.

TABLE 1

| Selector Output Based on Input Command | | |
|---|---|---|
| COMMAND | HIT_ | SELECTOR OUTPUT |
| 00 (STR_AUT) | 0 | HHA |
| 00 (STR_AUT) | 1 | HEA |
| 01 (STMP_HHA) | x | HHA |
| 10 (STR_HEA) | x | HEA |
| 11 | x | x |

As can be seen from the above table, when the COMMAND is STR_AUT, the second selector 142 selects HHA or HEA according to whether the retrieval detected a hit (HIT_=0) or a miss (HIT_=1) respectively. When the COMMAND is STMP_HHA, HHA is selected irrespective of the contents of HIT_. When the COMMAND is STR_HEA, HEA is selected irrespective of the contents of HIT_. When the COMMAND is 11, indicating that none of STR_AUT, STMP_HHA, and STR_HEA has been input, the first selector 141 is in a ready condition for selecting the external address (ADDRESS), ignoring the state of the second selector 142.

Like the second selector 142, the mask data register group 130 also receives COMMAND and HIT_ as inputs. When the COMMAND from the mask data register group 130 is 11, the mask data register that stores the mask data, which masks the data part other than the address data (first data part) shown in FIG. 5, is selected out of the input retrieval data. When the second selector 142 can select HHA, i.e., when the COMMAND is STRAUT and, at the same time, HIT_ is at logic 0 or when COMMAND is STR_HHA, a mask data register is selected that stores the mask data which masks a data part other than the time stamp information (second data part) shown in FIG. 5. When, on the other hand, the second selector 142 can select HEA, i.e., when COMMAND is STR_AUT and, at the same time, HIT_ is at logic 1 or when COMMAND is STR_HEA, a mask data register is selected that stores the mask data which masks neither data part of input data IN_DATA.

Next, the operations of the CAM 200 shown in FIG. 2 are described along the time schedule shown in FIG. 1. When a network frame is transmitted to a network frame switch provided with the CAM 200, a destination address DA is extracted from the network frame to generate retrieval data having the destination address DA. The mask data register group 130 starts retrieval after selecting mask data, from the retrieval data, that recognizes the destination address DA as a retrieval target (step a). Subsequent to the SRCH_DA processing at step a, the CAM 200, in which pipeline processing is effected, receives retrieval data, including the source address SA extracted from the network frame and the time stamp information of the current_time time slot as input. The mask data register group 130 selects mask data that recognizes the source address SA out of the retrieval data, as a valid retrieval part, to start retrieval (step c).

Subsequent to the SRCH_SA operation, the CAM receives STR_AUT as an input. Specifically, COMMAND shown in FIG. 2 is set to 00, which represents STR_AUT, and also, COMMAND_EXST is set so that the first selector 141 may select HHA or HEA output from the second selector 142.

In the CAM 200, in response to the contents of SRCH_DA, an address which stores the same address as the destination address DA is output as HHA and latched in the latching circuit 143 and then output from CAM 200. The HHA address is input to the RAM 36 (see FIG. 4) to be used to read out port numbers. Subsequently, in the CAM 200, in response to the contents of SRCH_SA, HHA is output and latched in the first latching circuit 143 if a hit (HIT_=0) is detected. Also, HEA is latched in the second latching circuit 114 irrespective of whether a hit or miss is detected. If a miss is detected, the HEA address is input to RAM 36, to be used to write in the port numbers of the ports from which network frames have been transmitted. Since the second selector 142 operates as listed in Table 1 and STR_AUT=00 is input in this case, when HIT_=0, i.e., the same address as the source address SA is detected, HHA latched in the first latching circuit 143 is selected and input to the first selector 141 and is input to the CAM core 110. At the same time, the mask data register group 130 sets mask data therein that recognizes the time stamp information out of the retrieval data including the source address SA and the time stamp information, as being valid. Then, when CE_ is input with the R/W_ signal hold at Low, the time stamp information of the CAM core 110's address HHA is overwritten by the time stamp information of the current time slot.

If, on the other hand, HIT_=1 is detected, i.e., if the same address as the source address SA is not detected as a result of retrieval based on the source address SA, the second selector 142 selects HEA, which is then input to the CAM core 110 via the first selector 141.

At the same time, the mask data register group 130 selects the mask data that validates all the bits of the retrieval data consisting of the source address SA and the time stamp information. Also, by inputting CE_ with the R/W_ signal held down at Low, the source address SA and the time stamp information of the current time slot are written in address HEA of the CAM core 110.

Thus, in the present embodiment, the CAM 200 performs processing that, based on the STR_AUT operations, i.e. the retrieval results, updates the time stamp information of HHA or writes the source address SA and the time stamp information in HEA. This largely accelerates the series of operations and, therefore, enables high_speed switching of network frames as compared to the conventional CAM.

The embodiment of FIG. 2 has the STMP_HHA and STR_HEA commands and, therefore, is capable of performing the conventional operations. That is, the contents of HIT_, i.e., the retrieval results by use of the source address HIT_, can be decided externally and, if as a result HIT_=0 (hit) is detected, COMMAND may be set to STMP_HHA(01) so that the second selector 142 selects HHA. At the same time, the mask data register group 130 can rewrite the time stamp information of HHA, recognizing only the time stamp information as valid data. On the other hand, if HIT_=1 (miss), COMMAND is set to STR_HEA (10), so that the second selector 142 selects HEA and, at the same time, the mask data register group 130 may write both the source address SA and the time stamp information, i.e., entire retrieval data, in HEA as valid data. That is, the CAM 200 of FIG. 2 can be adapted to the conventional network frame switchs.

Although the preferred embodiment of the present invention has been described in detail, it should be understood that various changes, substitutions and alternations can be made therein without departing from the spirit and scope of the inventions as defined by the appended claims.

What is claimed is:

1. A content addressable memory (CAM), comprising:
    a plurality of word memories, each of the word memories including at least a first and a second data piece, each of the data pieces being independently writeable;
    a plurality of registers, each of the registers corresponding to one of the word memories, and storing information that indicates whether valid or invalid data is stored in the corresponding one of the word memories; and
    a retrieval result correspondence write-in device, wherein when the first data piece of at least one of the word memories matches a first part of an input retrieval data, the CAM only writes to a second part of the input retrieval data into the second piece of said one word memories as a second data piece, and when none of the word memories contain a first data piece that matches the first part of the input retrieval data, the CAM writes the first and second input retrieval data into a word memory of the word memories having a corresponding register which indicates that data stored in the word memory is invalid.

2. The CAM according to claim 1, wherein the retrieval result correspondence write-in device operates in response to external commands which instruct how the retrieval result correspondence write-in device is to operate.

3. The CAM according to claim 1, wherein the retrieval result correspondence write-in device includes a selection device that selects mask information to mask retrieval data to be written in the word memories.

4. The CAM according to claim 1, wherein the retrieval result correspondence write-in device comprises a mask register group which holds mask information to mask retrieval data to be written in word memories in correspondence with each retrieval result, wherein the retrieval result correspondence write-in device selects one mask register from the mask register group that corresponds to each retrieval result.

5. A network frame switch for use in a communication network having a plurality of interconnected communication terminals and wherein the network frame switch switches a transmission/reception of a network frame as an aggregation of information including a transmission source communication terminal address, comprising:

a CAM that further comprises:

a plurality of word memories which store data, including addresses of communication terminals and time information indicative of the most recent time when the addresses were accessed, in such a way that the data can be rewritten;

registers which correspond to the plurality of word memories and which store information indicating whether valid retrieval data is stored in the corresponding word memories;

a retrieval data generation device which generates input retrieval data including address data indicative of source addresses extracted from a transmitted network frame and time information indicative of the current time, the retrieval data generation device supplying the retrieval data to the CAM; and a retrieval result correspondence write-in device, wherein the retrieval result correspondence write-in device retrieves word memories having valid target data that includes a communication terminal address, whose position corresponds to the address data in the input retrieval data, and wherein when one or more word memories are detected by the retrieval result correspondence write-in device, the retrieval result correspondence write-in device only writes the current time information in the retrieved word memories and, if no word memory is detected, the retrieval result correspondence write-in device writes the input retrieval data in a word memory selected from one or more word memories other than the word memories which store valid target data.

6. The network frame switch according to claim 5, wherein the time information includes time stamp information that discriminates a plurality of time slots, defining a plurality of prescribed time intervals that are cyclically switched, from each other.

7. The network frame switch according to claim 5 further comprising at least one RAM coupled to the CAM, wherein the network frame switch transfers the address data which corresponds to one selected word memory other than the word memories which store the valid target data from the CAM to the at least one RAM.

8. A method of retrieving data in a CAM having a plurality of word memories and a plurality of registers, each word memories having a plurality of data pieces and each of the registers corresponding to one of the word memories and storing information the indicates whether valid or invalid data is stored in the corresponding one of the word memories, comprising:

receiving retrieval data having a first data part and a second data part;

determining which word memories, if any, contain a first data piece that matches the first data part, wherein when at least one of the word memories contains a first data piece that matches a first data part of the retrieval data, the CAM only writes the second data part of the retrieval data into the one of the word memories as a second data piece, and wherein when none of the word memories contain a first data piece that matches the first data part of the retrieval data, the CAM writes the retrieval data into a word memory of the word memories having a corresponding register which indicates that data stored in the word memory is invalid.

9. The method according to claim 8, further comprising receiving external commands which instruct how the input data retrieval is to be performed.

10. The method according to claim 8, further comprising selecting mask information to mask retrieval data to be written in the word memories.

11. The method according to claim 8, wherein the CAM further has a mask register group which holds mask information to mask retrieval data to be written in word memories in correspondence with each retrieval result, wherein the method further comprises selecting one mask register from the mask register group that corresponds to each input data retrieval result.

* * * * *

UNITED STATES PATENT AND TRADEMARK OFFICE
CERTIFICATE OF CORRECTION

PATENT NO. : 6,070,223
DATED : May 30, 2000
INVENTOR(S) : Hiroshi Yoshizawa

Page 1 of 1

It is certified that error appears in the above-identified patent and that said Letters Patent is hereby corrected as shown below:

Title page,
Item 75, add Hideo Nakano;

Claim 1,
Line 12, delete "to".

Signed and Sealed this

Eighteenth Day of September, 2001

Attest:

*Nicholas P. Godici*

NICHOLAS P. GODICI
*Attesting Officer*  *Acting Director of the United States Patent and Trademark Office*